United States Patent
Koike et al.

(10) Patent No.: US 7,161,282 B2
(45) Date of Patent: Jan. 9, 2007

(54) VIBRATOR SUPPORT STRUCTURE AND MANUFACTURING METHOD FOR THE SUPPORT STRUCTURE

(75) Inventors: Masato Koike, Toyama-ken (JP); Katsumi Fujimoto, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 324 days.

(21) Appl. No.: 10/735,704

(22) Filed: Dec. 16, 2003

(65) Prior Publication Data

US 2004/0155560 A1  Aug. 12, 2004

(30) Foreign Application Priority Data

Feb. 12, 2003 (JP) .............................. 2003-034124
Oct. 2, 2003 (JP) .............................. 2003-343970

(51) Int. Cl.
*H01L 41/053* (2006.01)
(52) U.S. Cl. .................... 310/348; 310/330; 310/331; 310/357
(58) Field of Classification Search ................ 310/330, 310/331, 348, 357
See application file for complete search history.

(56) References Cited

U.S. PATENT DOCUMENTS

| 4,706,350 | A | * | 11/1987 | Mooney et al. ............. 29/25.35 |
| 5,170,089 | A | * | 12/1992 | Fulton ......................... 310/328 |
| 6,116,086 | A | * | 9/2000 | Fujimoto .................. 73/504.14 |
| 2001/0015594 | A1 | * | 8/2001 | Mori et al. .................. 310/330 |
| 2005/0040734 | A1 | * | 2/2005 | Kinoshita .................... 310/348 |

FOREIGN PATENT DOCUMENTS

| JP | 57-154921 | * 9/1982 | ................. 310/348 |
| JP | 06-221854 | 8/1994 | |
| JP | 06-258082 | 9/1994 | |
| JP | 2000-146593 | 5/2000 | |
| JP | 2001-227953 | 8/2001 | |

* cited by examiner

*Primary Examiner*—Thomas M. Dougherty
(74) *Attorney, Agent, or Firm*—Keating & Bennett, LLP

(57) ABSTRACT

In a vibrator support structure, a vibrator is supported on a substrate through support pins, substrate connection portions of the support pins and pin connection portions of the substrate are joined through conductive adhesive which is made of a resin including conductive filler and has a pencil hardness of about 4H or less, and the conductive adhesive has a thickness which can buffer vibrations and impacts propagated through the support pins.

13 Claims, 5 Drawing Sheets

VIBRATOR SUPPORT STRUCTURE AND MANUFACTURING METHOD FOR THE SUPPORT STRUCTURE

BACKGROUND OF THE INVENTION

1. Field of the Invention

The present invention relates to a vibrator support structure and to a method of manufacturing the support structure.

2. Description of the Related Art

Up to now, in vibrating gyroscopes, a vibrator support structure provided with a vibrator having a bending vibration mode, support pins for supporting the vibrator, and a substrate on which the vibrator is mounted through the support pins has been adopted. That is, in the vibrator, a pair of piezoelectric substrates oppositely polarized in the thickness direction are joined so as to face each other, and one piezoelectric substrate, on which first and second detector electrodes are formed so as to be separated from each other, and the other piezoelectric substrate, on the entire surface of which a drive electrode is formed, are joined so as to sandwich an intermediate electrode.

Then, the support pins are attached to the first and second detector electrodes at locations corresponding to vibration nodal points and also the support pins are attached to the drive electrode at locations corresponding to vibration nodal points. Furthermore, a substrate connection portion, which is an outer end portion of each support pin, is joined to each pin connection portion provided on the substrate by soldering. Accordingly, the vibrator is mounted on the substrate through the support pins and is supported so as to be able to perform bending vibration (see Japanese Unexamined Patent Application Publication No. 2001-227953, for example).

Moreover, in another vibrator support structure, a substrate connection portion, which is an outer end portion of an L-shaped support pin, is inserted into a through-hole of an attachment part which is not the substrate, and the substrate connection portion of the support pin is fixed to the attachment part by soldering. In this support structure, a separate buffer material is placed between the attachment part and the substrate (see Japanese Unexamined Patent Application Publication No. 6-221854 and Japanese Unexamined Patent Application Publication No. 6-258082, for example).

In the vibrator support structures of the related art, the substrate connection portion of the support pins and the pin connection portion of the substrate are joined by soldering. However, since the solder, which is a metal, is solidified and hardens, vibrations leaking from the vibrator are easily propagated to the substrate through the support pins and a residual stress is easily caused in the support pins. Furthermore, in such a support structure, it becomes easy for impacts applied to the substrate from the outside to be directly propagated to the vibrator through the support pins.

On the other hand, in a vibrator support structure in which an attachment part fixed on a substrate with a buffer material therebetween and a substrate connection portion of a support pin are soldered, there is an advantage in that the vibrations and impacts propagated through the support pin are weakened by the buffer material. However, the fact is that, since it is necessary to place a buffer material between the attachment part and the substrate, the number of parts increases and the structure becomes complicated, and, as a result, this requires additional during the assembling process.

Moreover, as long as a vibrator support structure using soldering is adopted, reflow mounting of a vibrating gyroscope accompanied by the re-melting of solder cannot be avoided. Accordingly, the trouble of changing the balance between parts in the vibrator support structure, that is, damage of support conditions due to the release of residual stress, etc., is likely to occur.

SUMMARY OF THE INVENTION

In order to overcome the problems described above, preferred embodiments of the present invention provide a vibrator support structure in which vibrations and impacts propagated through support pins are buffered, and also provide a method of manufacturing such a novel vibrator support structure.

A vibrator support structure according to a first preferred embodiment of the present invention includes a vibrator, a substrate, and support pins. In the support structure of a vibrator, the vibrator is supported on the substrate through the support pins, substrate connection portions of the support pins and pin connection portions of the substrate are joined through a conductive adhesive which is made of resin including a conductive filler and has a pencil hardness of about 4H or less, and the conductive adhesive has a thickness which can buffer vibrations and impacts propagated through the support pins. Accordingly, the propagation of a vibration leaking from the vibrator to the substrate through the support pins and the propagation of impacts applied to the vibrator from the outside through the support pins are effectively suppressed. Therefore, without providing any separate buffer material, the occurrence of residual stress to the support pins and damage of the vibrator can be prevented. Furthermore, when constructed in this way, variations in height (co-planarity) of the support pins can be compensated for.

In a vibrator support structure of preferred embodiments of the present invention, an opening allowing conductive adhesive existing between the vibrator connection portion of the support pins and the vibrator to ooze out is provided in the vibrator connection portion of the support pins.

In a vibrator support structure of preferred embodiments of the present invention, an opening allowing conductive adhesive existing between the substrate connection portion of the support pins and the pin connection portion of the substrate to ooze out is provided in the substrate connection portion of the support pins. When the opening is provided, since the contacting area between the conductive adhesive and the support pins increases, the vibrator connection portion of the support pins and the vibrator or the substrate connection portion of the support pins and the pin connection portion of the substrate can be more strongly joined.

A method of manufacturing a vibrator support structure according to another preferred embodiment of the present invention includes the step of hardening conductive adhesive for joining the substrate connection portion of the support pins and the pin connection portion of the substrate, the conductive adhesive existing therebetween, while only the weight of the vibrator and the support pins is applied. Accordingly, no residual stress occurs in the support pins after the conductive adhesive has been hardened and a sufficient thickness of the conductive adhesive can be obtained to buffer vibrations and impacts.

A manufacturing method for a vibrator support structure of various preferred embodiments of the present invention preferably further includes the step of coating each of the substrate connection portion and the pin connection portion with conductive adhesive in advance for joining the substrate connection portion of the support pins and the pin connection portion of the substrate. Accordingly, a sufficient quantity of conductive adhesive can be placed between the substrate connection portion and the pin connection portion. Therefore, it becomes possible to arrange the conductive adhesive to effectively buffer vibrations and impacts.

Other features, elements, characteristics, steps and advantages of the present invention will become more apparent form the following detailed description of preferred embodiments with reference to the attached drawings.

DETAILED DESCRIPTION OF PREFERRED EMBODIMENTS

Figure 1:
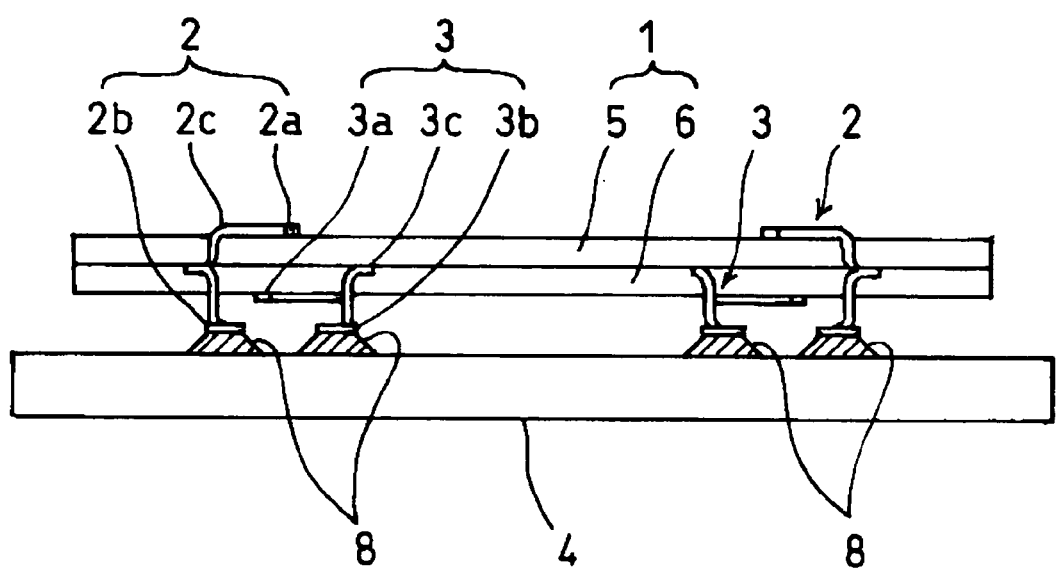
FIG. 1 is a side view showing the assembled state of a vibrator support structure of according to a preferred embodiment of the present invention.
Figure 2:
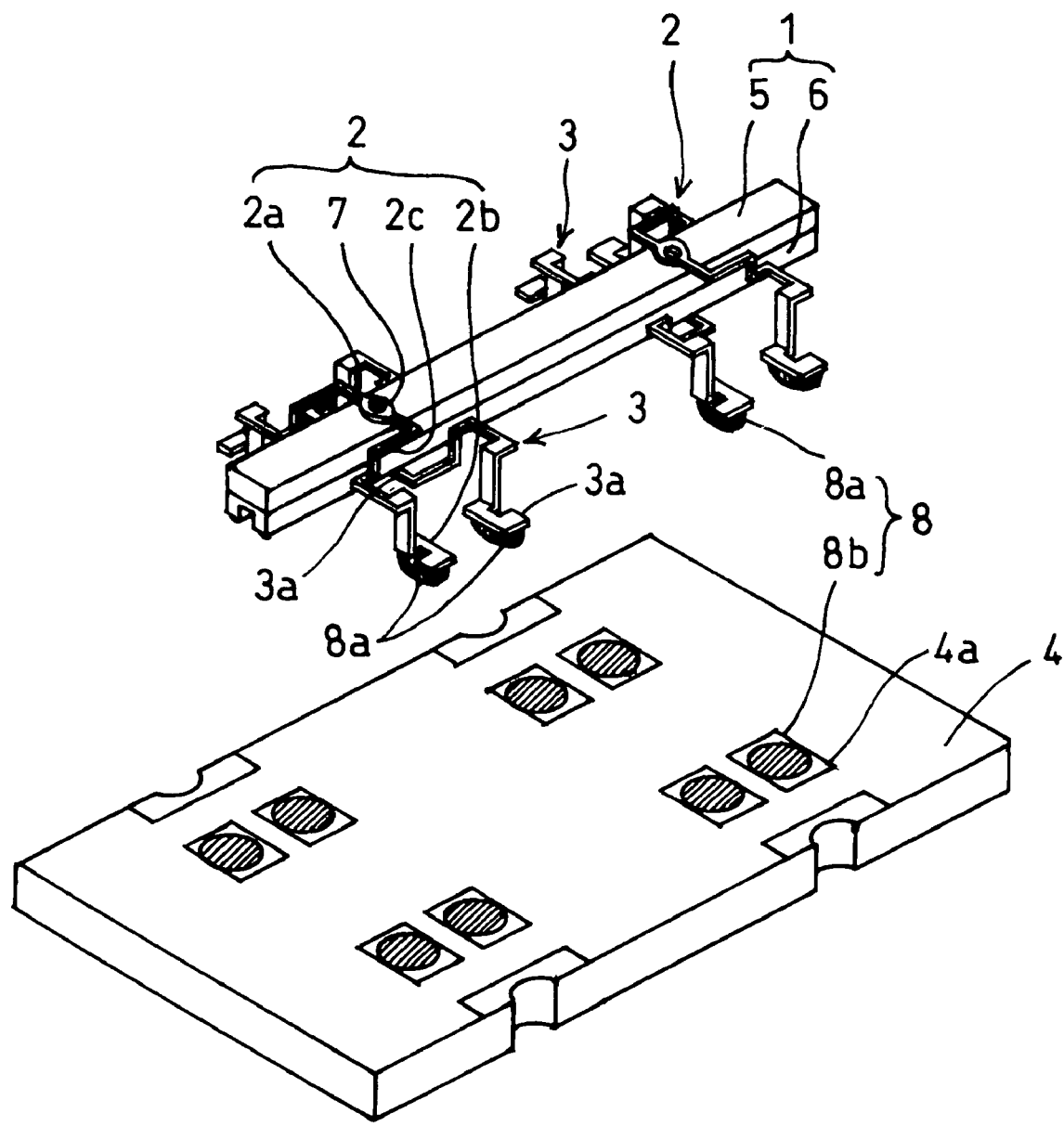
FIG. 2 is a perspective view showing the disassembled state of the vibrator support structure according to a preferred embodiment of the present invention.
Figure 3:
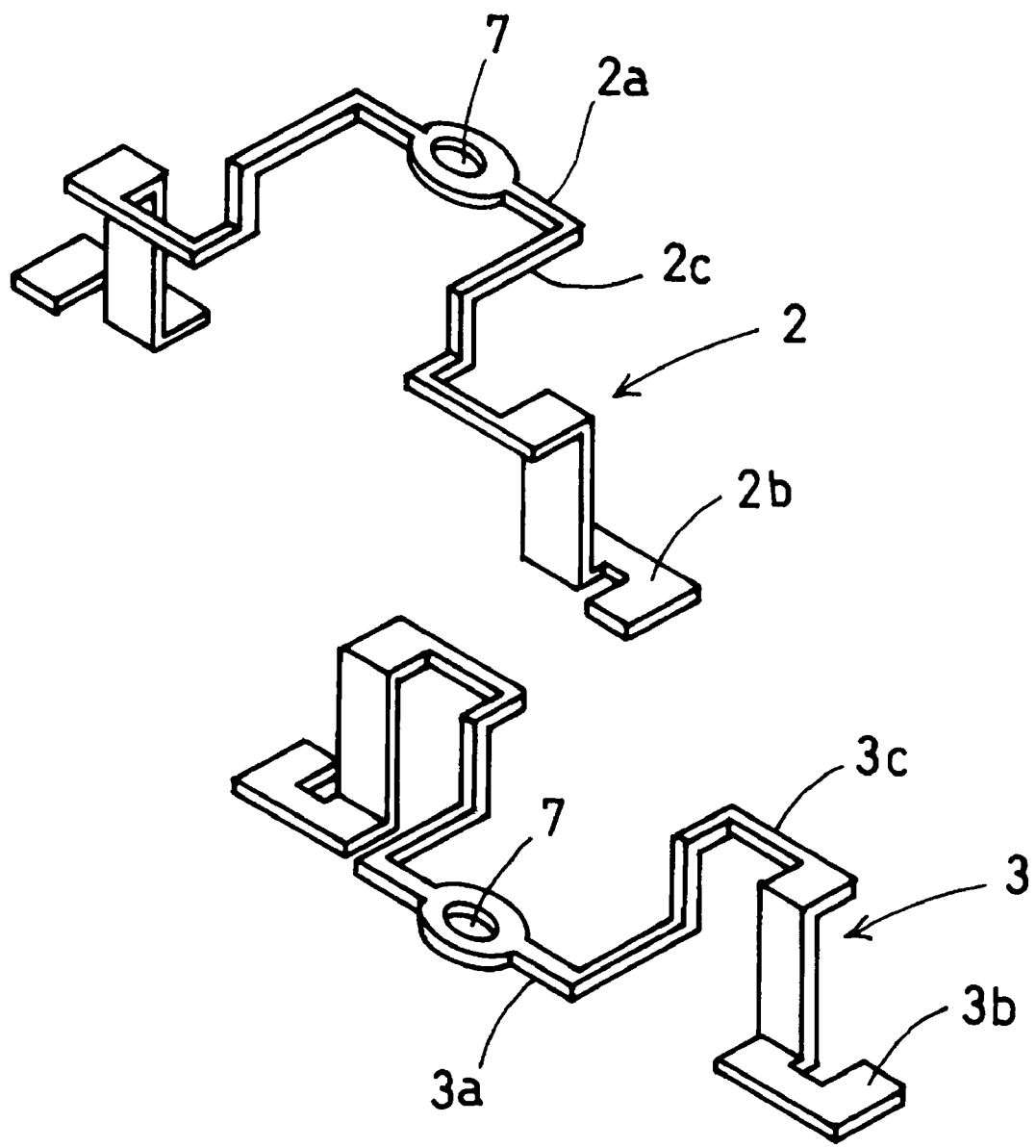
FIG. 3 is an expanded perspective view showing support pins according to a preferred embodiment of the present invention.
Figure 4:
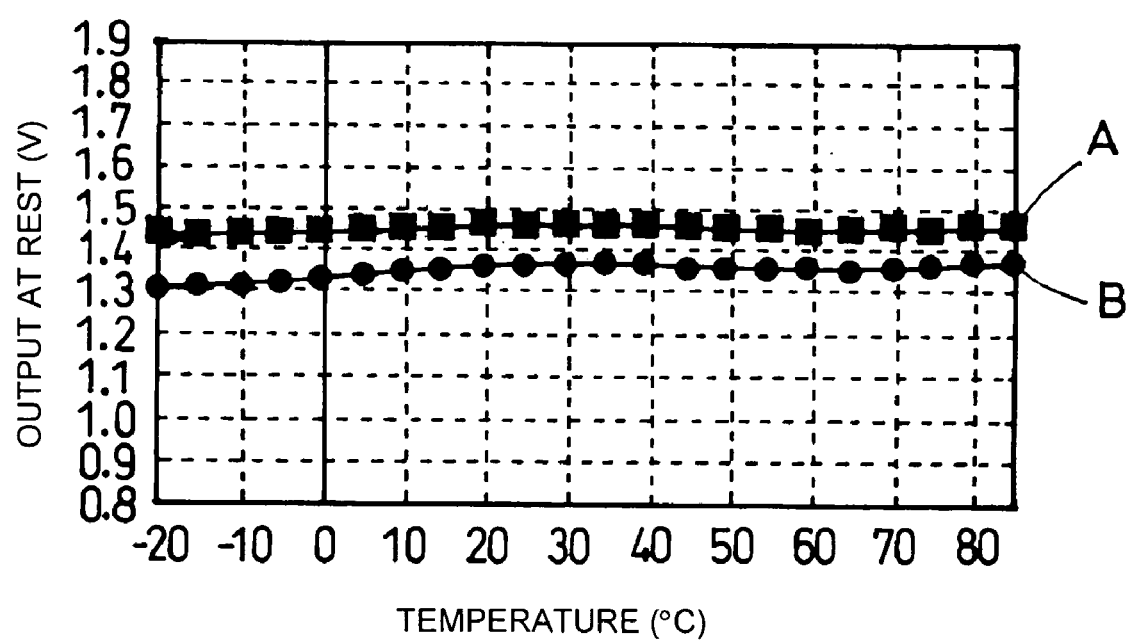
FIG. 4 shows the temperature characteristics of drift of a vibrating gyroscope in which the vibrator support structure according to a preferred embodiment of the present invention is adopted.
Figure 5:
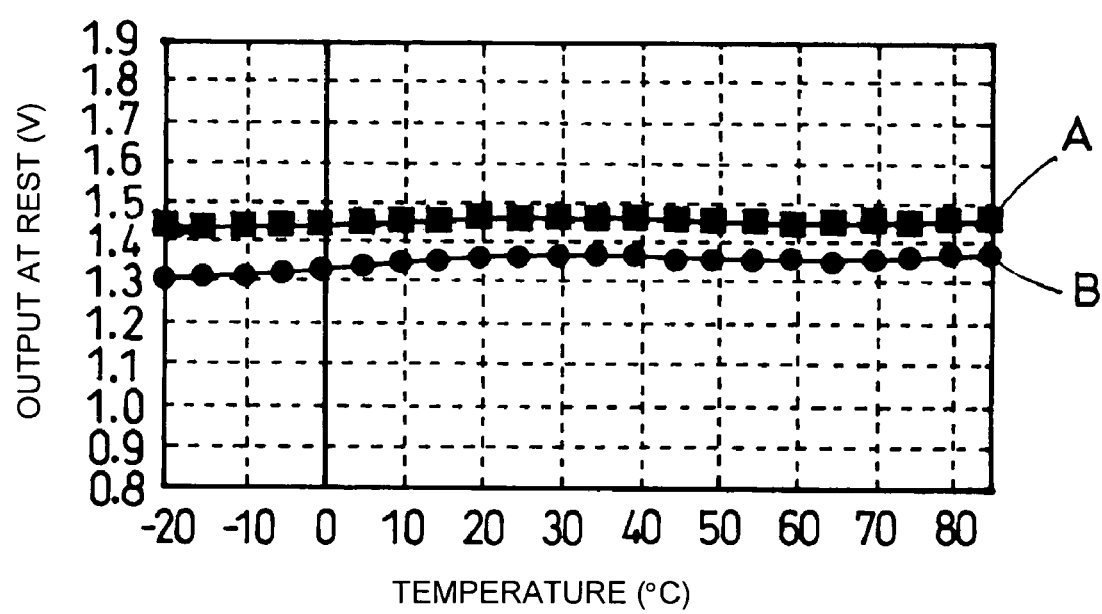
FIG. 5 shows the temperature characteristics of drift of a vibrating gyroscope in which the vibrator support structure according to a preferred embodiment of the present invention is adopted after the vibrating gyroscope has been reflow-mounted.

FIG. 1 is a side view showing the assembled state of a vibrator support structure according to a preferred embodiment of the present invention, FIG. 2 is a perspective view showing the disassembled state of the vibrator support structure according to the present preferred embodiment, and FIG. 3 is an expanded perspective view showing support pins according to the present preferred embodiment. FIGS. 4 and 5 show temperature characteristics of drift of vibrating gyroscopes. The temperature characteristics of drift means the change in output at rest while no angular velocity is applied, that is, the change in output versus temperature at rest. Moreover, in FIGS. 4 and 5, the vertical axis represents output (V) at rest and the horizontal axis represents temperature (° C.).

The vibrator support structure according to the present preferred embodiment is adopted in vibrating gyroscopes, etc., and, as shown in FIGS. 1 and 2, includes a vibrator 1 preferably in the form of a substantially rectangular solid having a bending vibration mode, four support pins 2 and 3 for supporting the vibrator 1, and a substrate 4 on which the vibrator 1 is mounted through the support pins 2 and 3. Moreover, the support pins 2 and 3 are made of a thin metal plate and are bent into the shapes shown in FIGS. 2 and 3.

In the vibrator 1, a pair of piezoelectric substrates 5 and 6, which are oppositely polarized in the thickness direction, are joined together, and a drive electrode (not illustrated) is arranged on the entire outer surface of one piezoelectric substrate 5. On the outer surface of the other piezoelectric substrate 6, first and second detector electrodes (not illustrated), which are separate from each other, are formed, and the inner surfaces of the piezoelectric substrates 5 and 6 are joined so as to sandwich an intermediate electrode (not illustrated).

Vibrator connection portions 2a of the support pins 2 are joined to locations corresponding to vibration nodal points of the drive electrode disposed on the piezoelectric substrate 5 by using conductive adhesive, that is, a conductive adhesive made of resin containing a conductive filler and having the same hardness as a pencil hardness of approximately 4H or less. Also, vibrator connection portions 3a of the support pins 3 are joined to locations corresponding to vibration nodal points at the first and second detector electrodes disposed on the piezoelectric substrate 6 using the conductive adhesive (not illustrated).

That is, the support pins 2 and 3 include the vibrator connection portions 2a and 3a in the width direction of the vibrator 1, substrate connection portions 2b and 3b facing the substrate 4, and connection portions 2c and 3c which are extended in a direction so as to move away from the vibrator 1 and bent downward or upward after being extended in the length direction of the vibrator 1 and bent downward. Moreover, SA2024 (product name) produced by Fujikura Kasei Co., Ltd. can be given as a specific example of the conductive adhesive used in the present preferred embodiment.

In each of the vibrator connection portions 2a and 3a of the support pins 2 and 3, an opening 7 such as a round hole, etc., which allows the conductive adhesive between the vibrator connection portions 2a or 3a and the vibrator 1 to ooze out is provided. So, the conductive adhesive existing between the vibrator conductor portions 2a and 3a of the support pins 2 and 3 and the vibrator 1 oozes out through each opening 7 and runs to the outer surface of the vibrator connection portions 2a and 3a which do not face the vibrator 1 and hardens. As a result, the vibrator connection portions 2a and 3a of the support pins 2 and 3 and the vibrator 1 are securely joined by the conductive adhesive which continues to maintain a certain level of elasticity after the hardening. Moreover, the opening 7 is not limited to a round hole, but may be a square hole, a cut groove, etc.

Furthermore, the substrate connection portions 2b and 3b, which are outer end portions of the support pins 2 and 3 for supporting the vibrator 1, are joined to the pin connection portions 4a which are positioned and formed on the mounting surface of the substrate 4 so as to correspond to the substrate connection portions 2b and 3b by using conductive adhesive existing therebetween. At this time, the conductive adhesive 8 for joining the substrate connection portions 2b and 3b of the support pins 2 and 3 to the pin connection portions 4a of the substrate 4 has a thickness which can sufficiently buffer the vibrations and impacts propagated through the support pins 2 and 3, that is, the thickness between the substrate connection portions 2b and 3b and the pin connection portions 4a.

Moreover, although not illustrated, the substrate connection portions 2b and 3b of the support pins 2 and 3 may be provided with the same type of opening as the vibrator connection portions 2a and 3a. When such an opening is provided, since the conductive adhesive existing between the substrate connection portions 2b and 3b of the support pins 2 and 3 and the pin connection portions 4a of the substrate 4 oozes out through the opening, it becomes possible to securely join the substrate connection portions 2b and 3b and the pin connection portions 4a.

That is, when the above-described support structure, in which the vibrator 1 is mounted on the substrate 4 through the support pins 2 and 3, is used in a vibrating gyroscope and a signal is input between each of the detector electrodes and the drive electrode, the vibrator 1 performs bending vibration in a direction which is substantially perpendicular to the surface where the drive electrode is formed. Furthermore, when a rotational force is applied to the vibrator 1, the vibration direction changes because of the Coriolis force and a signal corresponding to the change of the vibration direction is output from the detector electrodes. Therefore, when the output signal is measured, a rotational angular velocity applied to the vibrator 1 can be detected.

On the other hand, when the support structure of the vibrator 1 according to the present preferred embodiment is manufactured, the following assembly process is preferably adopted. First of all, the vibrator connection portions 2a and 3a of the support pins 2 and 3 are joined to the top and bottom surfaces, respectively, of the vibrator 1 using conductive adhesive. Next, the substrate connection portions 2b and 3b of the support pins 2 and 3 joined to the vibrator 1 are coated with a sufficient quantity of conductive adhesive 8. Then, the substrate conduction portions 2b and 3b of the support pins 2 and 3 coated with the conductive adhesive 8 are positioned on the respective pin connection portions 4a of the substrate 4 and held.

After that, the conductive adhesive 8 existing between the substrate connection portions 2b and 3b and the pin connection portions 4a is hardened while only the weight of the vibrator 1 and support pins 2 and 3 is applied. At this time, since no external force other than the height of the vibrator 1 and the support pins 2 and 3 is applied to the conductive adhesive 8, the hardened conductive adhesive 8 has a sufficient thickness for buffering vibrations and impacts propagating through the support pins 2 and 3 and there is no residual stress left in the support pins 2 and 3.

Accordingly, the propagation of vibrations leaking from the vibrator 1 through the support pins 2 and 3 and the direct propagation of impacts applied to the substrate 4 to the vibrator 1 through the support pins 2 and 3 are suppressed by the conductive adhesive 8, which continues to maintain sufficient elasticity after hardening. Moreover, in the present preferred embodiment, although preferably only the substrate connection portions 2b and 3b of the support pins 2 and 3 are coated with the conductive adhesive 8, as shown in FIG. 2, each of the substrate connection portions 2b and 3b and the pin connection portions 4a may be coated with half of the conductive adhesive 8a and 8b, and then, it becomes possible to easily apply a sufficient quantity of the conductive adhesive 8.

Now, although the support structure of the vibrator 1 is adopted in a vibrating gyroscope, it is known that the stability of vibrating gyroscopes is judged by temperature characteristics of drift, and it is desirable that, regarding the temperature characteristics of drift, the output at rest or stationary state be flat in the measurement temperature range. So, the inventor of the present invention and others have measured the temperature characteristics of drift of two vibrating gyroscopes in which the support structure of the vibrator 1 described in the present preferred embodiment is used, and the result of the measurement was obtained as shown in FIG. 4. That is, in the vibrating gyroscopes A and B which adopted the support structure according to the present preferred embodiment, it was discovered that the output at rest is flat in the measurement temperature range and the support structure of the vibrator 1 is stable.

Furthermore, when a vibrating gyroscope is reflow-mounted, there was a fear that the support structure of the vibrator 1 may become unstable, but, when the inventor of the present invention and others made measurements of the temperature characteristics of drift of the vibrating gyroscopes A and B after they were reflow-mounted, the measurement results shown in FIG. 5 were obtained. According to these measurement results, the temperature characteristics of drift were not deteriorated by the reflow mounting, and, since the support structure of the vibrator 1 continued to be stable, the balance between the parts did not change; that is, the support condition did not change by the release of residual stress, etc. Moreover, the support structure of the vibrator 1 is applied to not only vibrating gyroscopes, but can also be applied to other electronic components.

In Japanese Unexamined Patent Application Publication No. 2000-146593, it is disclosed that the leakage of vibration to the support pins from the vibrator can be prevented by connecting the vibrator and the support pins through conductive adhesive. In this case, the conductive adhesive mainly acts as a buffer for the vibration, and it may be said that it is analogous to the contraction of preferred embodiments of the present invention in that the conductive adhesive is utilized as a vibration buffer. However, when the pencil hardness is low, the increased viscosity may prevent the vibrator from vibrating. Accordingly, when the vibrator and the support pins are joined, it becomes necessary to set the lower limit of the pencil hardness so as not to prevent the vibrator from vibrating.

On the other hand, in the case of preferred embodiments of the present invention, the main portion of the vibration buffer is the support pins and the connection portion between the support pins and the substrate constitutes the remainder of the function of the vibration buffer. Therefore, the lower limit of the pencil hardness is not particularly defined. That is, the present invention and the technology described in Japanese Unexamined Patent Application Publication No. 2000-146593 are not the same.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A vibrator support structure comprising:
a vibrator;
a substrate; and
support pins, wherein the vibrator is supported on the substrate through the support pins, wherein substrate connection portions of the support pins and pin connection portions of the substrate are joined through conductive adhesive which is made of resin including a conductive filler and has a pencil hardness of about 4H or less, and the conductive adhesive has a thickness that is sufficient to buffer vibrations and impacts propagated through the support pins.

2. A vibrator support structure as claimed in claim 1, wherein an opening allowing portions of the conductive adhesive existing between the vibrator connection portion of the support pins and the vibrator to ooze out is provided in the vibrator connection portion of the support pins.

3. A vibrator support structure as claimed in claim 1, wherein an opening allowing portions of the conductive adhesive existing between the substrate connection portion of the support pins and the pin connection portion of the substrate to ooze out is provided in the substrate connection portion of the support pins.

4. A vibrator support structure as claimed in claim 1, wherein the vibrator has a substantially rectangular solid configuration.

5. A vibrator support structure as claimed in claim 1, wherein at least four of the support pins are provided.

6. A vibrator support structure as claimed in claim 1, wherein the support pins are made of a thin metal plate.

7. A vibrator support structure as claimed in claim 1, wherein the substrate is a piezoelectric substrate.

8. A vibrator support structure as claimed in claim 1, wherein the vibrator includes a pair of piezoelectric substrates.

9. A vibrator support structure as claimed in claim 8, wherein the pair of piezoelectric substrates are polarized in opposite directions.

10. A vibrator support structure as claimed in claim 1, wherein the vibrator connection portions of the support pins are joined to locations corresponding to vibration nodal points of the vibrator.

11. A vibrator support structure as claimed in claim 2, wherein the opening has one of a round shape, a square shape and a cut groove configuration.

12. A vibrator support structure as claimed in claim 3, wherein the opening has one of a round shape, a square shape and a cut groove configuration.

13. A vibrator support structure as claimed in claim 1, wherein a first opening allowing portions of the conductive adhesive existing between the vibrator connection portion of the support pins and the vibrator to ooze out is provided in the vibrator connection portion of the support pins, and a second opening allowing portions of the conductive adhesive existing between the substrate connection portion of the support pins and the pin connection portion of the substrate to ooze out is provided in the substrate connection portion of the support pins, the first and second openings having substantially the same configuration.

* * * * *